(12) United States Patent
Fujiwara et al.

(10) Patent No.: US 9,691,858 B2
(45) Date of Patent: Jun. 27, 2017

(54) SILICON CARBIDE SEMICONDUCTOR DEVICE AND MANUFACTURING METHOD THEREFOR

(71) Applicant: Mitsubishi Electric Corporation, Tokyo (JP)

(72) Inventors: Nobuo Fujiwara, Tokyo (JP); Yasuhiro Kagawa, Tokyo (JP); Rina Tanaka, Tokyo (JP); Yutaka Fukui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/418,730

(22) PCT Filed: Jul. 25, 2013

(86) PCT No.: PCT/JP2013/070240
§ 371 (c)(1),
(2) Date: Jan. 30, 2015

(87) PCT Pub. No.: WO2014/021199
PCT Pub. Date: Feb. 6, 2014

(65) Prior Publication Data
US 2015/0287789 A1    Oct. 8, 2015

(30) Foreign Application Priority Data
Aug. 1, 2012 (JP) ................................. 2012-171328

(51) Int. Cl.
*H01L 29/78* (2006.01)
*H01L 31/028* (2006.01)
(Continued)

(52) U.S. Cl.
CPC .... *H01L 29/1608* (2013.01); *H01L 21/02378* (2013.01); *H01L 21/02529* (2013.01);
(Continued)

(58) Field of Classification Search
CPC ...................... H01L 29/66704; H01L 29/1608
See application file for complete search history.

(56) References Cited

U.S. PATENT DOCUMENTS

| 6,472,708 B1 | 10/2002 | Hshieh et al. |
| 2005/0017293 A1* | 1/2005 | Zundel .............. H01L 29/42368 257/329 |

(Continued)

FOREIGN PATENT DOCUMENTS

| JP | 10 294456 | 11/1998 |
| JP | 2004 521479 | 7/2004 |

(Continued)

OTHER PUBLICATIONS

Office Action issued Jun. 9, 2015 in Japanese Patent Application No. 2014-528110 (with English language translation).

(Continued)

*Primary Examiner* — Jerome Jackson, Jr.
(74) *Attorney, Agent, or Firm* — Oblon, McClelland, Maier & Neustadt, L.L.P.

(57) ABSTRACT

A silicon carbide semiconductor device includes trenches formed in a lattice shape on the surface of a silicon carbide substrate on which a semiconductor layer is formed, and gate electrodes formed inside of the trenches via a gate insulating film. The depth of the trenches is smaller in a portion where the trenches are crossingly formed than in a portion where the trenches are formed in parallel to each other. Consequently, the silicon carbide semiconductor device is obtained that increases a withstand voltage between the gate electrodes and corresponding drain electrodes on the semiconductor device rear surface to prevent dielectric breakdown and, at the same time, has a large area of the gate electrodes, high channel density per unit area, and low ON resistance.

6 Claims, 7 Drawing Sheets

(51) Int. Cl.
- H01L 29/16 (2006.01)
- H01L 29/66 (2006.01)
- H01L 21/02 (2006.01)
- H01L 21/3065 (2006.01)
- H01L 21/308 (2006.01)
- H01L 29/06 (2006.01)
- H01L 29/423 (2006.01)
- H01L 21/04 (2006.01)

(52) U.S. Cl.
CPC ........ *H01L 21/0475* (2013.01); *H01L 21/308* (2013.01); *H01L 21/3065* (2013.01); *H01L 29/0696* (2013.01); *H01L 29/4236* (2013.01); *H01L 29/4238* (2013.01); *H01L 29/66068* (2013.01); *H01L 29/66666* (2013.01); *H01L 29/7813* (2013.01); *H01L 29/7827* (2013.01); *H01L 21/046* (2013.01); *H01L 21/049* (2013.01)

(56) References Cited

U.S. PATENT DOCUMENTS

2006/0189063 A1* 8/2006 Hueting ............... H01L 29/7813 438/209

2010/0159649 A1* 6/2010 Parthasarathy ..... H01L 29/7397 438/138
2011/0227149 A1 9/2011 Hsu
2013/0313635 A1* 11/2013 Nakano ............... H01L 21/8213 257/330

FOREIGN PATENT DOCUMENTS

| JP | 2007 165657 | 6/2007 |
| JP | 2007 523487 | 8/2007 |
| JP | 2007 531246 | 11/2007 |

OTHER PUBLICATIONS

International Search Report Issued Oct. 29, 2013 in PCT/JP13/070240 Filed Jul. 25, 2013.

Office Action issued Nov. 23, 2016 in Chinese Patent Application No. 201380041189.2 (with partial English language translation).

Combined Office Action and Search Report issued Aug. 3, 2016 in Chinese Patent Application No. 201380041189.2 (with Partial English language translation and English translation of Categories of Cited Documents).

Chinese Office Action dated Feb. 21, 2017, issued in Chinese Patent Application No. 201380041189.2 (with English translation).

* cited by examiner (a)

(b)

(a)

(b)

(c)

(d)

(e)

(a)

(b)

(c)

(d)

(e)

ns (a)

(b)

(c)

(d)

(e)

(a)

(b)

(c)

(d)

(d)

(f)

SILICON CARBIDE SEMICONDUCTOR DEVICE AND MANUFACTURING METHOD THEREFOR

FIELD

The present invention relates to a silicon carbide semiconductor device and a manufacturing method therefor and, more particularly, to a silicon carbide semiconductor device of a trench-gate type and a manufacturing method therefor.

BACKGROUND

A MOSFET including silicon carbide is widely used for a semiconductor device having a high withstand voltage and low loss and capable of performing high-speed switching. In particular, regarding a trench-gate type silicon carbide MOSFET (Metal-Oxide-Semiconductor Field-Effect Transistor), compared with a normal planar type silicon carbide MOSFET, it is possible to greatly improve channel density per unit area and increase an amount of electric current. Therefore, a reduction in ON resistance is expected.

In the trench-gate type silicon carbide MOSFET, in general, on an n-type semiconductor substrate, an epitaxial layer of an n-type semiconductor with low defect density is formed, and a p-type semiconductor layer is formed by an ion injection method. A high-concentration n+ layer connected to a source electrode, and a high-concentration p+ layer connected to the p-type semiconductor layer are formed on the surface of the n-type semiconductor substrate by the ion injection method, and trenches are formed to pierce through the p-type semiconductor layer.

A gate insulating film and a gate electrode material are filled in the trenches. The gate electrode material is etched to form gate electrodes. In a region where trenches cross in the surface direction of the n-type semiconductor substrate, the gate electrode material is not completely filled and a recessed region is formed near the center region. In a process in which the gate electrodes are formed by the etching, side etching and vertical etching equally occur in the recessed region. The side etching advances to the gate electrode material in the trenches adjacent to the regions where the trenches cross. As a result, the area of the gate electrodes decreases, channel density per unit area cannot be increased, and a reduction in ON resistance cannot be performed. The trench-gate type silicon carbide MOSFET has a structure in which the gate electrodes are embedded. Therefore, in some case, the distance between a drain electrode on the rear surface of the MOSFET and the corresponding gate electrode decreases and dielectric breakdown occurs.

As measures against such a problem, there is proposed a structure in which, in the bottom of trenches, insulating films (e.g., $SiO_2$) are formed thicker than the other portions to improve a withstand voltage of gate electrodes (see, Patent Literature 1). There is also proposed a structure in which p-type semiconductor layers are formed in the bottom of trenches instead of the $SiO_2$ and, when a voltage is applied to gate electrodes, depletion layers are formed in the bottom of the trenches to increase a withstand voltage (see, Patent Literature 2).

CITATION LIST

Patent Literature

Patent Literature 1: Japanese Translation of International Patent Application No. 2007-531246

Patent Literature 2: Japanese Translation of International Patent Application No. 2007-523487

SUMMARY

Technical Problem

In the trench-gate type silicon carbide MOSFET (Metal-Oxide-Semiconductor Field-Effect Transistor), it is possible to form $SiO_2$ layers or p-type semiconductor layers in the bottom of the trenches and increase a withstand voltage between the gate electrodes and the corresponding drain electrodes on the semiconductor device rear surface. However, at the same time, there is a problem in that it is necessary to perform an extremely complicated process. There is also a problem in that, irrespective of which of the methods is used, no measure can be taken against an increase in ON resistance due to a decrease in the area of the gate electrodes.

The present invention has been devised in view of such problems and it is an object of the present invention to obtain a silicon carbide semiconductor device that can increase a withstand voltage between gate electrodes and the corresponding drain electrodes on a semiconductor device rear surface to prevent dielectric breakdown and, at the same time, increase the area of the gate electrodes, increase channel density per unit area, and reduce ON resistance.

Solution to Problem

In order to solve the aforementioned problems, a silicon carbide semiconductor device is constructed in such a manner that it includes: trenches formed in a lattice shape on a surface of a silicon carbide substrate on which a semiconductor layer is formed; and gate electrodes formed inside of the trenches via an insulating film, wherein the depth of the trenches is smaller in a portion where the trenches are crossingly formed than in a portion where the trenches are formed in parallel to each other.

Advantageous Effects of Invention

In the silicon carbide semiconductor device according to the present invention, the depth of the crossing portion of the trenches is formed smaller than the portion where the trenches are arranged in parallel. Therefore, when the gate electrodes are formed inside of the trenches, in the crossing portion of the trenches where electric field concentration occurs most, dielectric breakdown does not occur because the distance between the gate electrodes and the corresponding drain electrodes on the semiconductor device rear surface is large. A gate electrode material filled in the trenches can be preferentially etched in the vertical direction by anisotropic etching, and thus the area of each of the gate electrodes is not narrowed. Therefore, it is possible to increase an ON current per unit area.

DESCRIPTION OF EMBODIMENTS

Figure 1:
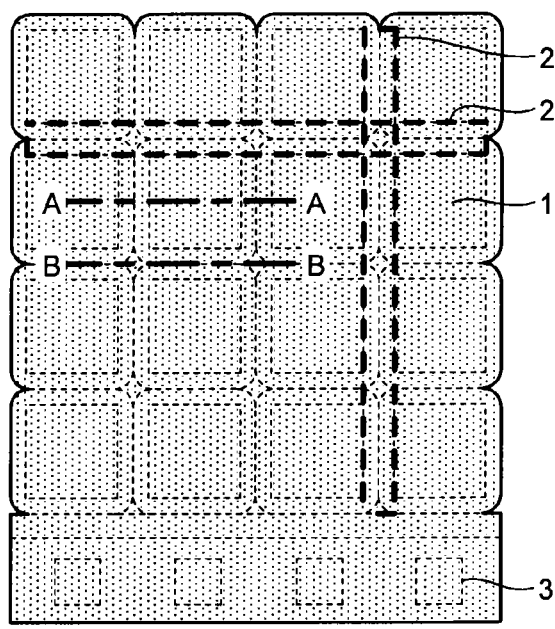
FIG. 1 is a top view of a MOSFET according to a first embodiment of the present invention.

In explanation of embodiments and in figures, portions denoted by the same reference numerals and signs indicate the same or equivalent portions.

First Embodiment

<Structure of a Trench-gate Type Silicon Carbide MOSFET>

Figure 2:
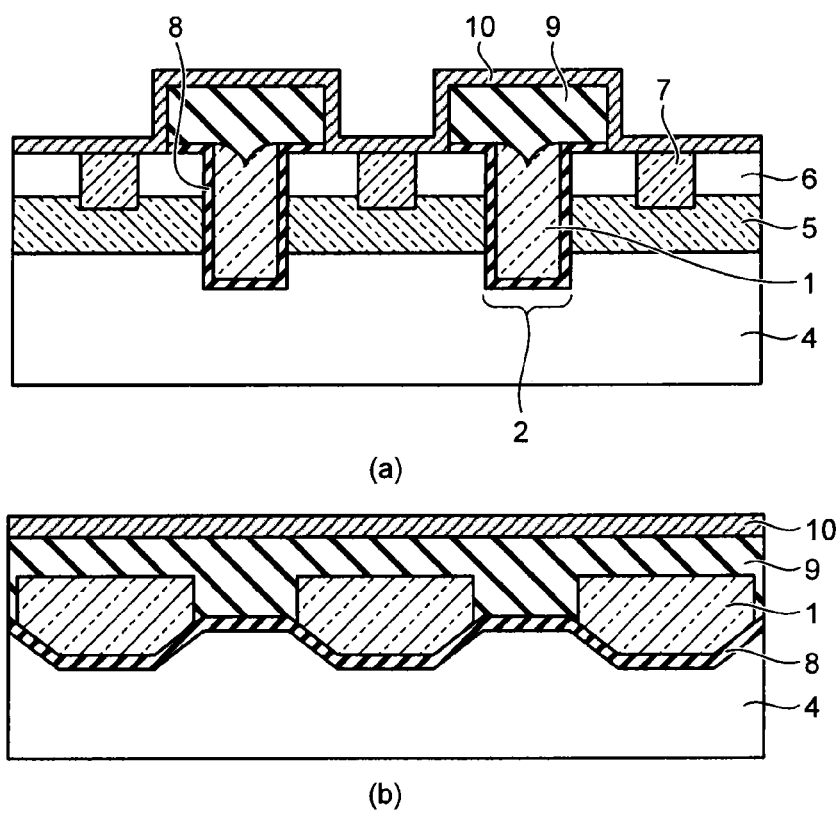
FIG. 2 is a sectional view of the MOSFET according to the first embodiment of the present invention ((a) is an A-A sectional view and (b) is a B-B sectional view).
Figure 3:
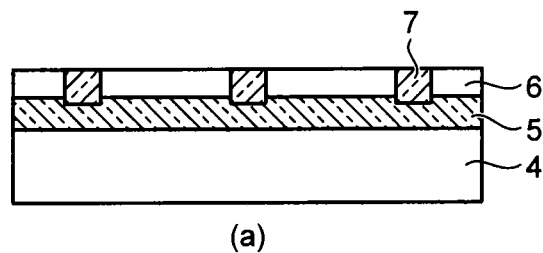
FIG. 3 is a sectional view for explaining a manufacturing process for the MOSFET according to the first embodiment of the present invention (an A-A sectional view).
Figure 3:
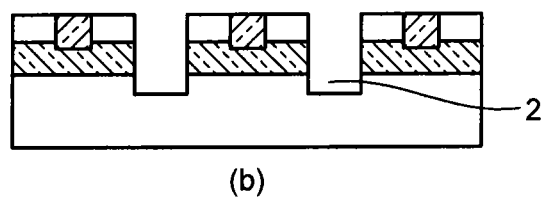
Figure 3:
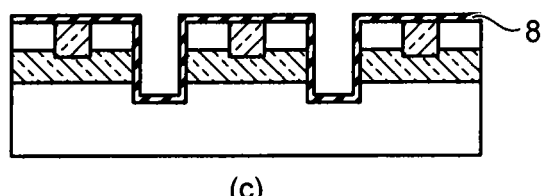
Figure 3:
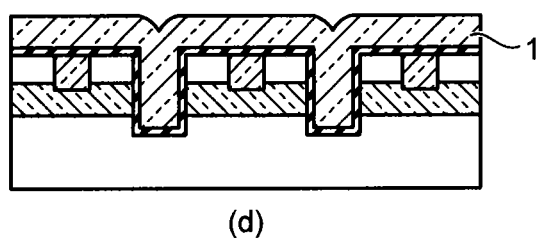
Figure 3:
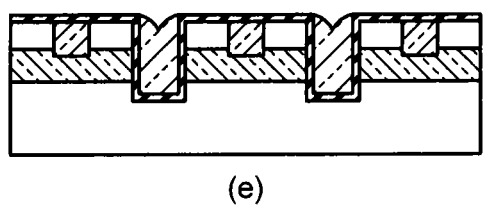
Figure 4:
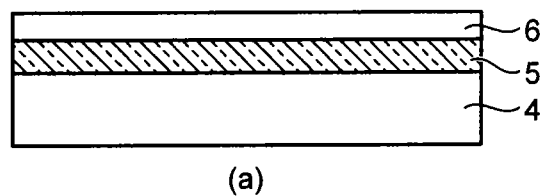
FIG. 4 is a sectional view for explaining the manufacturing process for the MOSFET according to the first embodiment of the present invention (a B-B sectional view).
Figure 4:
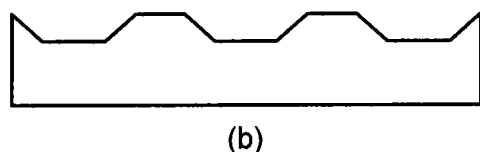
Figure 4:
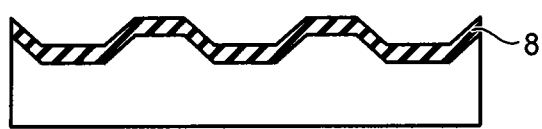
Figure 4:
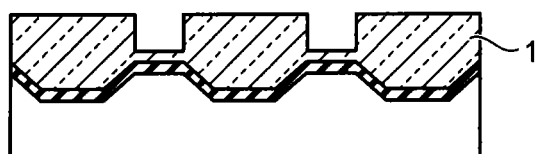
Figure 4:
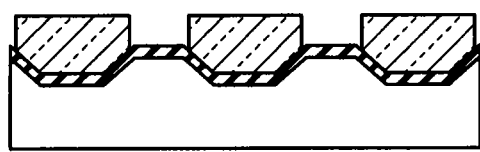

The structure of a trench-gate type silicon carbide MOSFET, which is a silicon carbide semiconductor device, according to a first embodiment of the present invention is explained with reference to FIG. 1 and FIG. 2. An overview of a manufacturing process for the trench-gate type silicon carbide MOSFET according to the first embodiment of the present invention is explained with reference to FIG. 3 and FIG. 4. FIG. 1 is a top view of the MOSFET according to the first embodiment. FIG. 2 is a sectional view of the trench-gate type silicon carbide MOSFET according to the first embodiment of the present invention. FIG. 2($a$) is an A-A sectional view of FIG. 1. FIG. 2($b$) is a B-B sectional view of FIG. 1. FIG. 3 and FIG. 4 are sectional views for explaining a manufacturing process for the trench-gate type silicon carbide MOSFET according to this embodiment. FIG. 3 shows a manufacturing process for an A-A cross section of FIG. 1. FIG. 4 shows a manufacturing process for a B-B cross section of FIG. 1.

In the trench-gate type silicon carbide MOSFET, trenches 2 (as an example of trenches, one trench 2 in the longitudinal direction and one trench 2 in the lateral direction are shown by being surrounded by thick dotted lines) are formed in a lattice shape on a silicon carbide semiconductor substrate. The MOSFET can be formed at high density by forming gate electrodes inside of the trenches 2. In FIG. 1, source electrodes 10 are formed in the top layer. Signals to gate electrodes inside of the trenches 2 are collectively input from electric contact regions 3.

Sectional views of an A-A cross section traversing the trenches shown in FIG. 1 and a B-B cross section taken along the trenches are respectively shown in FIGS. 2($a$) and ($b$). In FIG. 3 and FIG. 4, a manufacturing process for the trench-gate silicon carbide MOSFET is shown (FIG. 3 shows the A-A cross section of FIG. 1, which is a cross section of the MOSFET, and FIG. 4 shows the B-B cross section of FIG. 1, which is a cross section of a portion taken along the trench).

In the trench-gate silicon carbide MOSFET, an n-type epitaxial silicon carbide layer 4 with low defect density is formed on a silicon carbide substrate of an n-type (not shown in the figure). Subsequently, a p-type silicon carbide layer 5 is formed by an ion injection method. Further, an n+-type silicon carbide layer 6 connected to a source electrode and p+-type silicon carbide layers 7, which become connecting sections to the p-type silicon carbide layer 5, are formed on the surface of the p-type silicon carbide layer 5 using the ion injection method (FIG. 3($a$) and FIG. 4($a$)). The n+-type silicon carbide layer 6 and the p+-type silicon carbide layers 7 are formed in the same layer. Injection of an ion dopant is controlled using a mask such that the p+-type silicon carbide layers 7 are formed in an island shape. Trenches 2 are formed in a lattice shape on the surface of the substrate. The trenches 2 are formed to pierce through the n+-type silicon carbide layer 6 and the p-type silicon carbide layer 5 (FIG. 3($b$) and FIG. 4($b$)).

Subsequently, a gate insulating film 8 consisting of $SiO_2$ is formed on the substrate surface and the inner wall surfaces of the trenches 2 (FIG. 3($c$) and FIG. 4($c$)). Further, polysilicon, which becomes gate electrodes 1, is filled in the trenches 2 (FIG. 3($d$) and FIG. 4($d$)). The polysilicon is etched to form the gate electrode 1 (FIG. 3($e$) and FIG. 4($e$)). Finally, as shown in FIG. 2 (not shown in FIG. 3 and FIG. 4), an insulating film 9 is formed on the gate electrodes 1. After patterning the insulating film 9, a source electrode 10 is formed.

<Formation of the Trenches>

We formed the trenches 2 by dry-etching a silicon carbide layer using a mask for trench formation, wherein we used a normal method for the dry etching and etched the trenches 2 by using mixed gas plasma of carbon tetrafluoride ($CF_4$)/oxygen ($O_2$)/argon (Ar). Flow rates of $CF_4$ and $O_2$ were respectively set to 30 ml/minute so as to set a ratio of $CF_4$ and $O_2$ to 1:1 and a flow rate of Ar is set to 40ml/minute, which was 40% of a total flow rate. Conditions of plasma generation power 1000 watt at 13.56 megahertz and a substrate bias of 120 watt at 13.56 megahertz were used in an inductively-coupled plasma etching device. The width of the formed trenches 2 was about 2 micrometers. The trenches 2 were formed at an interval of 5 micrometers in the longitudinal direction and the lateral direction.

In the formation of the trenches 2 using the dry etching, the width of the trenches 2 greatly affects the depth of the trenches 2. That is, the dry etching advances while etching species, which is emitted from plasma with directionality and increases etching depth, and deposition species, which inhibits the progress of the etching without having directionality, affect each other. An actual etching amount is an amount obtained by combining a deposition amount and an etching amount. In general, the deposition species has a tendency of suppressing $O_2$ concentration and increasing when the Ar flow rate with respect to the total flow rate is reduced.

Because the ionic etching species has the directionality, the etching species easily enters the narrow trenches 2. In a narrow portion, the influence of the etching species is relatively large. On the other hand, because the deposition species is neutral and does not have directionality, the deposition species less easily enters the narrow trenches 2 and easily enters a wide portion. Therefore, in the wide portion, the influence of the deposition species is relatively large. That is, in a portion where the trenches 2 are formed parallel to each other, the trenches 2 are deeply etched because the width of the trenches 2 is small and the influence of the etching species is large. In a portion where the trenches 2 cross, the trenches 2 are shallowly etched because the width of the trenches 2 is large (about 1.4 times) and the influence of the deposition species is large. The portion where the trenches 2 cross assumes a square shape in the surface direction of the silicon carbide substrate of the n-type.

The width of the trenches 2 in the portion where the trenches 2 cross means maximum width and corresponds to the length of the diagonal line in the square shape.

Figure 5:
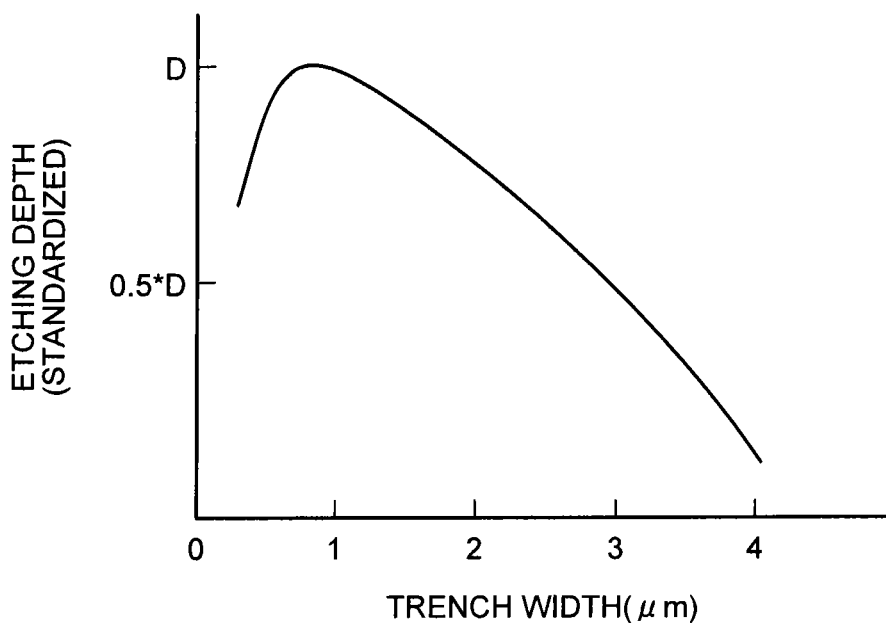
FIG. 5 is a diagram for explaining a relation between etching depth of etching and trench width used in the first embodiment of the present invention.

When process conditions such as a type and a composition ratio of the mixed gas were adjusted on the basis of this tendency and the silicon carbide layer was etched to form the trenches 2, the relation of etching depth and the width of the trenches 2 shown in FIG. 5 was obtained. In FIG. 5, the abscissa indicates the width of the trenches 2 and the ordinate indicates etching depth standardized by depth D in the case of deepest etching.

As shown in FIG. 5, the etching depth is small when the width of the trenches 2 is large. The etching depth is large when the width of the trenches 2 is small. In the case of this embodiment, it is seen that the width of the trenches 2 is about 2 micrometers, the standardized etching depth is about 0.7 D, and the standardized etching depth of the crossing portion where the width of the trenches 2 is large (the width of the trenches 2 is about 2.8 micrometers, which is about 1.4 times as large as the width of the trenches 2 in the other portions) is about 0.5 D.

As shown in FIG. 2(b), the depth of the trenches 2 formed in this embodiment is smaller in the portion where the trenches 2 cross than in the portion where the trenches 2 are formed in parallel. The depth of the trenches 2 in the portion where the trenches 2 are formed in parallel to each other is about 2 micrometers and the depth of the portion where the trenches 2 cross is about 1.5 micrometers. Note that, in both of the parallel portion and the crossing portion, the bottom of the respective trenches 2 is the n-type epitaxial silicon carbide layer 4 under the p-type silicon carbide layer 5.

<Formation of the Gate Electrodes>

A film of polysilicon, which is a gate electrode material, is formed on the silicon carbide layer surface, in which the trenches 2 are formed, by a thermal CVD method. According to the thermal CVD method, because the thermal CVD method does not have strong directionality unlike film formation by a plasma CVD method or the like, the film is formed in uniform thickness irrespective of the shape of the surface. That is, in the case of this embodiment, because the width of the trenches 2 is about 2 micrometers, when the polysilicon, which is the gate electrode material, is vapor-deposited by thermal CVD at the thickness of 1 micrometer from the surface, as shown in FIG. 3(b), in the portion where the trenches 2 are formed parallel to each other, a film of the polysilicon having the thickness of about 1 micrometer is formed on both side surfaces of the trenches. Consequently, the polysilicon grows from the periphery and the inside of the trenches 2 can be filled with the polysilicon.

In the crossing portion, because the width of the trenches 2 is large, even if a film of the polysilicon having the thickness of 1 micrometer is formed on the bottom surface and the side surfaces of the trenches 2, the inside of the trenches 2 cannot be filed with the polysilicon growing from the periphery unlike the portion where the trenches 2 are parallel to each other, and a polysilicon layer 1 micrometer from the bottom surface of the trenches 2 is formed (FIG. 4(d)). That is, in a region where the trenches 2 cross in the surface direction of the silicon carbide substrate of the n-type, because the gate electrode material is not completely filled, a recessed region having a square pole shape is formed near the center region.

Figure 6:
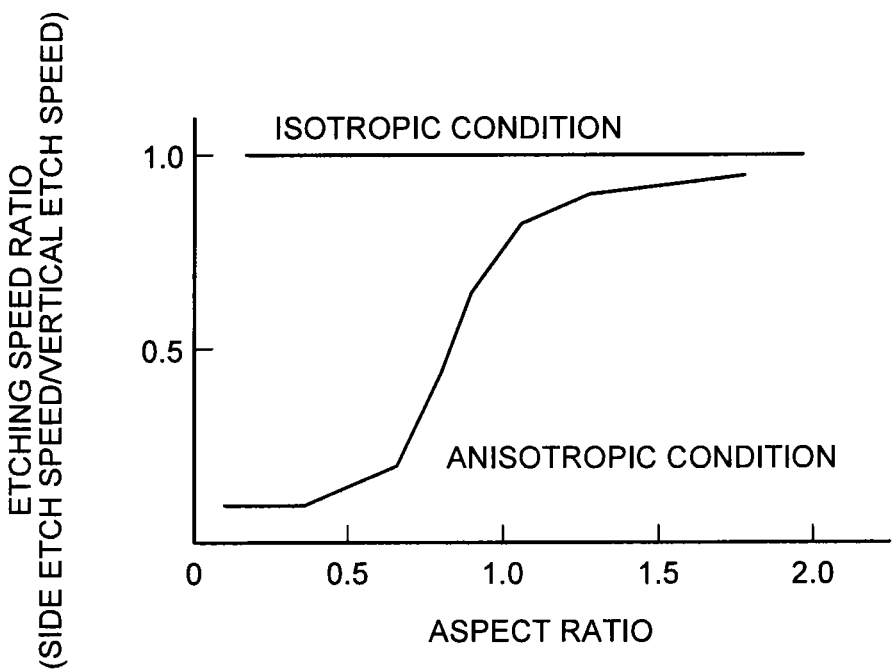
FIG. 6 is a diagram for explaining a relation between an etching speed ratio of the etching and an aspect ratio of trenches used in the first embodiment of the present invention.

The etching of the polysilicon, which is the gate electrode material, is explained. In FIG. 6, the relation between an etching speed ratio of the etching and an aspect ratio of the trenches 2 used in the first embodiment of the present invention is shown. The abscissa indicates the aspect ratio of the trenches 2. The aspect ratio is defined by depth/width of the trenches 2. The ordinate indicates the speed ratio of the etching. The etching speed ratio is defined by side etching speed/vertical etching speed. The vertical etching speed is substantially fixed irrespective of conditions. When the side etching speed is low, the etching speed ratio is small. When the side etching speed increases, the etching speed ratio approaches isotropy (the etching speed ratio=1).

In this embodiment, for the etching of the polysilicon, which is the gate electrode material, a chlorine gas was used as an etching gas. A very small amount of oxygen was added to the etching gas to perform anisotropic etching. It is seen that, in the anisotropic etching, when the aspect ratio of the trenches 2 is large (the depth of the trenches 2 is large), side etching and vertical etching occur at substantially the same speed and, when the aspect ratio of the trenches 2 is small (the depth of the trenches 2 is small), the side etching hardly occurs and the vertical etching mainly occurs.

In this embodiment, as shown in FIG. 4(d), the crossing portion of the trenches 2 is shallow (as specific sizes, the width of the trenches 2 is 2.8 micrometers, and the depth of the trenches 2 is 1.5 micrometers, the gate electrode material having 1 micrometer is formed on the bottom of the trenches 2 and both sides of the trenches 2, the width of the trenches 2 is 0.8 micrometer and the depth of the trenches 2 is 0.5 micrometer, and the aspect ratio of the trenches 2 is 0.5 µm/0.8 µm=0.63.) and the etching speed ratio is about 0.2 from FIG. 6. Therefore, the etching of the polysilicon is preferentially performed in the depth direction. A decrease in the area of the gate electrodes due to the side etching hardly occurs (FIG. 4(e)). That is, the side etching hardly advances from the recessed region formed near the center of the region, where the trenches 2 cross in the surface direction of the silicon carbide substrate of the n-type, to the polysilicon in the trenches 2 adjacent to the region where the trenches 2 cross. Therefore, the problem in that ON resistance increases because of a decrease in the area of the gate electrodes due to the side etching does not occur.

In the trench-gate type silicon carbide MOSFET in this embodiment, in the crossing portion of the trenches 2 where electric fields concentrate most, the distance between a drain electrode on the semiconductor device rear surface and the corresponding gate electrode 1 is larger than the other portions. Therefore, semiconductor device deterioration due to dielectric breakdown does not occur. It is possible to obtain high reliability.

In this embodiment, the dry etching by the mixed gas plasma of $CF_4/O_2/Ar$ is used for the formation of the trenches 2. However, the formation of the trenches 2 is not limited to this. Any etching method can be used as long as the etching method is capable of adjusting a balance between the deposit species and the etching species and changing the depth of the trenches 2 according to the width of the trenches 2 can be used.

In this embodiment, the etching gas obtained by adding oxygen to the chlorine gas is used for the etching of the polysilicon, which is the gate electrode material. However, the etching of the polysilicon is not limited to this. Any etching method can be used as long as the side etching and the vertical etching occur at different speeds according to the depth of the trenches 2 and the aspect ratio of the trenches 2 in the etching method.

In this embodiment, the width of the trenches 2 is set to 2 micrometers and the pitch of the trenches 2 is set to 5 micrometers. However, the width of the trenches 2 and the pitch of the trenches 2 are not limited to this. Any width and interval can be used as long as the trenches 2 can be stably formed. However, when the width of the trenches 2 is equal to or smaller than 0.5 micrometer and the pitch of the trenches 2 is equal to or smaller than 1 micrometer, caution is necessary because formation and etching of the gate insulating film and the gate electrode material are sometimes unstable. When the width of the trenches 2 is equal to or larger than 5 micrometers and the pitch thereof is equal to or larger than 20 micrometers, although the etching, the film formation, and the like are stable, there is a problem in that an ON current per unit area is the same degree as the ON current of the planar type silicon carbide MOSFET, and an effect of using a trench structure is reduced.

In this embodiment, as explained above, the depth of the trenches 2 in the portion where the trenches 2 are formed in parallel is about 2 micrometers. The depth of the trenches 2 in the portion where the trenches 2 are crossingly formed is about 1.5 micrometers. That is, the depth of the portion where the trenches 2 cross is about 75% of the depth of the portion where the trenches 2 are formed in parallel. However, the depth of the portions is not limited to this. To obtain the effects in this embodiment, the depth of the portion where the trenches 2 cross is preferably 10 to 90% and more preferably 40 to 80% of the depth of the portion where the trenches 2 are formed in parallel.

When the depth of the portion where the trenches 2 cross is smaller than 10% of the depth of the portion where the trenches 2 are formed in parallel, because the depth suddenly changes, there is a problem in that a large step is formed in the gate electrode 1 formed in each of the trenches 2 and deterioration easily occurs from the step portion. Further, when the depth of the portion where the trenches 2 cross is smaller than 40% of the depth of the portion where the trenches 2 are formed in parallel, because the remaining film of the gate electrode material in corner sections of the crossing portion of the trenches 2 is small, the original effect in this embodiment of improving connectivity of the gate electrode material is sometimes insufficient. When the depth of the portion where the trenches 2 cross is larger than 90% of the depth of the portion where the trenches 2 are formed in parallel, there is almost no difference between the depth of the crossing portion and the depth of the trenches 2 in the portion where the trenches 2 are formed in parallel. There is little merit in being capable of keeping the distance from the drain electrodes on the semiconductor device rear surface large. There is a problem in that dielectric breakdown easily occurs. Further, to clearly exhibit the effect of suppressing dielectric breakdown, the depth of the portion where the trenches 2 cross is preferably set to be equal to or lower than 80% of the depth of the portion where the trenches 2 are formed in parallel.

When the depth of the portion where the trenches 2 cross is equal to or smaller than 90% and more preferably equal to or smaller than 80% of the depth of the portion where the trenches 2 are formed in parallel, the distance between the drain electrodes on the semiconductor device rear surface and the corresponding gate electrodes 1 can be secured large. This is effective for prevention of dielectric breakdown.

In this embodiment, the aspect ratio of the crossing portion of the trenches 2 is set to 0.63. However, the aspect ratio is not particularly limited. The effects in this embodiment can be obtained as long as the aspect ratio is 0.1 to 1.

The aspect ratio is preferably 0.1 to 0.7 and more preferably 0.1 to 0.4. When the aspect ratio is smaller than 0.1, the influence of the side etching is small and preferable. However, there is a problem in that a complicated process for filling most of the trenches 2 deep with the gate electrode material is necessary. When the aspect ratio exceeds 1, anisotropy of the etching is insufficient and the side etching also occurs by a substantial amount. Therefore, there is also a problem in that the electrode area becomes small and the effect of reducing the ON resistance decreases.

When the aspect ratio is equal to or lower than 0.7 and more preferably equal to or lower than 0.4, it is possible to exhibit the effects in this embodiment more, reduce side etching speed through satisfactory anisotropic etching, and secure a gate electrode area per unit area large. Therefore, the ON resistance is not reduced.

Second Embodiment

In the first embodiment, in the process for forming the tranches 2 on the silicon carbide layer, the trenches 2 are formed using etching conditions under which the width of the trenches 2 affects the depth of the trenches 2. The n-type epitaxial silicon carbide layer 4 is formed on the silicon carbide semiconductor substrate. The p-type silicon carbide layer 5 is formed on the n-type epitaxial silicon carbide layer 4. The n+-type silicon carbide layer 6 and the p+-type silicon carbide layers 7 are formed on the surface of the p-type silicon carbide layer 5. The portion where the trenches 2 are formed in parallel and the portion where the trenches 2 cross have the different depths. However, the formed trenches 2 pierce through the p-type silicon carbide layer 5. The bottom of the trenches 2 is the n-type epitaxial silicon carbide layer 4 in both of the portion where the trenches 2 are formed in parallel and the portion where the trenches 2 cross.

This embodiment is different from the first embodiment in that the trenches 2 are formed shallow as a whole, in a portion where the trenches 2 are formed shallow in the crossing portion of the trenches 2, the bottom of the portion is the p-type silicon carbide layer 5, and in the portion where the trenches 2 are formed in parallel, the trenches 2 are relatively deep and the bottom of the portion is the n-type epitaxial silicon carbide layer 4.

Figure 7:
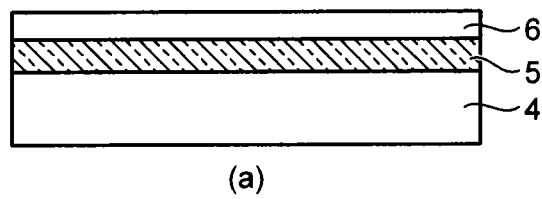
FIG. 7 is a sectional view for explaining a manufacturing process for a MOSFET according to a second embodiment of the present invention (a B-B sectional view).
Figure 7:
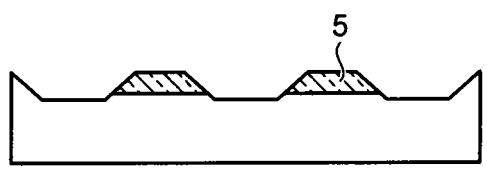
Figure 7:
Figure 7:
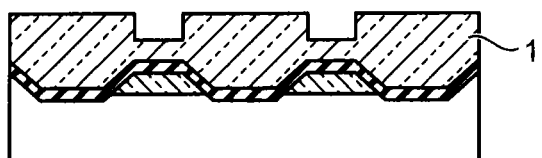
Figure 7:
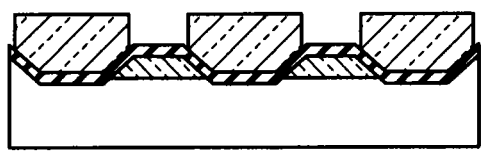

A manufacturing process for a trench-gate type silicon carbide MOSFET in this embodiment is shown in FIG. 7. FIG. 7 shows the B-B cross section of FIG. 1. The A-A cross section is omitted because the A-A cross section is the same as FIG. 3. In this embodiment, for formation of semiconductor layers on a silicon carbide substrate of an n-type, a method of forming the trenches 2, formation of a film of polysilicon, which is a gate electrode material, and an etching method, processes same as the processes in the first embodiment are used. However, only the depth of the trenches 2 is different from the depth of the trenches 2 in the first embodiment.

Specifically, in the first embodiment, the trenches 2 are formed with the depth of the trenches 2 in the portion where the trenches 2 arrayed in parallel set to 2 micrometers and with the depth of the trenches 2 in the portion where the trenches 2 cross set to 1.5 micrometers. In this embodiment, the trenches 2 are formed with the depth of the trenches 2 in the portion where the trenches 2 are arrayed in parallel set to 1.5 micrometers and with the depth of the trenches 2 in the portion where the trenches 2 cross set to 1 micrometer.

The depth of the trenches 2 is reduced by 0.5 micrometer. Therefore, in this embodiment, because the trenches 2 are formed shallow, the p-type silicon carbide layer 5, which is etched and does not remain in the trench bottom in the first embodiment, remains on the bottom surface of the trenches 2. Thereafter, the gate insulating film 8 and the gate electrodes 1 are formed by a method same as the method in the first embodiment.

In the crossing portion of the trenches 2, when a voltage is applied between the drain electrodes (not shown in the figure) on the lower surface of the semiconductor device and the corresponding gate electrodes 1, P-N junctions are formed under the gate electrodes 1 in the crossing portion of the trenches 2 where electric field concentration occurs most. Therefore, depletion layers are formed to block movement of charges. Therefore, dielectric breakdown between the drain electrodes and the corresponding gate electrodes 1 does not occur. It is possible to obtain the semiconductor device having high reliability.

The area per unit area of the gate electrodes 1 can be increased. Therefore, it is possible to increase channel density per unit area and reduce ON resistance.

Third Embodiment

In the first or second embodiment, in the process for forming the trenches 2 on the silicon carbide layer, the trenches 2 are formed using etching conditions under which the width of the trenches 2 affects the depth of the trenches 2. A third embodiment is different from the first and second embodiments in that the trenches 2 in the crossing portion of the trenches 2 can be formed shallow even under etching conditions under which the width of the trenches 2 does not affect the depth of the trenches 2. In the following explanation, a method of forming the trenches 2 is focused on and explained. A basic structure of a trench-gate type silicon carbide MOSFET according to the third embodiment can be set the same as the basic configuration in the first embodiment of the second embodiment. Processes other than a formation process for the trenches 2 in a manufacturing process for the trench-gate type silicon carbide MOSFET can be set the same as the processes explained in the first embodiment and the second embodiment.

In this embodiment, as in the second embodiment, a mask for formation of the trenches 2 is used when the trenches 2 are formed by etching. In the third embodiment, when the trenches 2 are formed by etching, another mask different from the mask for formation of the trenches 2 is further used. That is, in the third embodiment, before the trenches 2 are formed by etching, another mask different from the mask for formation of the trenches 2 is formed only in a portion where the trenches 2 are crossingly formed on the surface of a silicon carbide layer in which the trenches 2 are formed. Consequently, in the third embodiment, progress of etching of the silicon carbide layer in a portion where the trenches 2 cross is suppressed and the crossing portion of the trenches 2 is formed shallow.

Figure 8:
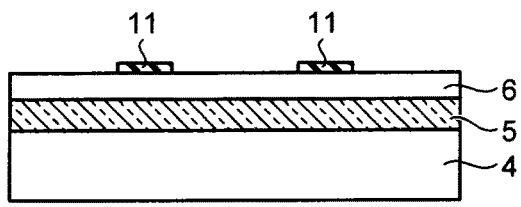
FIG. 8 is a sectional view for explaining a manufacturing process for a MOSFET according to a third embodiment of the present invention (a B-B sectional view).
Figure 8:
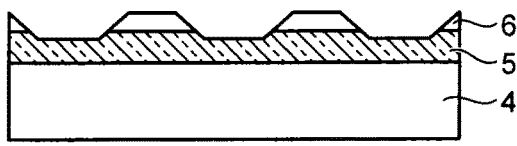
Figure 8:
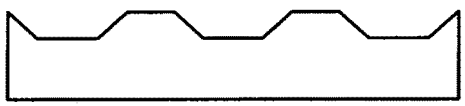
Figure 8:
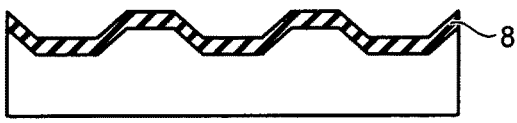
Figure 8:
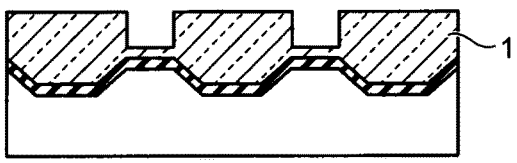
Figure 8:
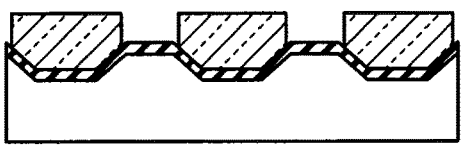

FIG. 8 is a sectional view for explaining the manufacturing process for the MOSFET according to the third embodiment. FIG. 8 corresponds to the B-B cross section of FIG. 1. The A-A cross section is omitted because the A-A cross section is the same as FIG. 3. In the third embodiment, for formation of semiconductor layers on a silicon carbide substrate of an n-type, formation of a film of polysilicon, which is a gate electrode material, and an etching method, processes same as the processes in the first embodiment are used.

In the third embodiment, an $SiO_2$ mask (a first mask) 11 is formed as a mask for etching formation of the trenches 2 on the surface of the silicon carbide layer in which the trenches 2 are formed. A method of forming the first mask is not particularly limited. A publicly-known method can be used. The first mask includes, on the n+-type silicon carbide layer 6, openings corresponding to patterns of the trenches 2.

Subsequently, a thin $SiO_2$ film is formed by, for example, a CVD method on the surface of the silicon carbide layer on which the first mask is formed. Subsequently, a resist is patterned on the thin $SiO_2$ film to cover only a portion near a region where the trenches 2 are crossingly formed in the surface of the thin $SiO_2$ film. The thin $SiO_2$ film is etched using the resist as a mask. Thereafter, the resist is removed.

Through such an additional process in this embodiment, in a region where the first mask is not formed (a region exposed from the first mask) on the surface of the silicon carbide layer in which the trenches 2 are formed, only the portion where the trenches 2 are crossingly formed is covered with the thin $SiO_2$ film (a second mask) (FIG. 8(a)). On the other hand, in the region where the first mask is not formed (the region exposed from the first mask) on the surface of the silicon carbide layer in which the trenches 2 are formed, the surface of the silicon carbide layer (the n+-type silicon carbide layer 6) is exposed in the other region where the trenches 2 are formed parallel to each other.

Following such formation of the masks, dry etching of trench formation is carried out using the first mask and the second mask as etching masks. When the dry etching is started, in the region where the first mask is not formed on the surface of the silicon carbide layer (the n+-type silicon carbide layer 6) in which the trenches 2 are formed, a region other than the region where the trenches 2 are crossingly formed, that is, the region where the trenches 2 are formed in parallel to each other is immediately started to be etched simultaneously with the start of the etching.

On the other hand, the region where the trenches 2 are crossingly formed in the region where the first mask is not formed on the surface of the silicon carbide layer (the n+-type silicon carbide layer 6) in which the trenches 2 are formed is covered with the second mask (the thin $SiO_2$ film). Therefore, first, the second mask is etched and removed (FIG. 8(b)). After the second mask is etched and removed, etching of the surface of the silicon carbide layer (the n+-type silicon carbide layer 6) in the region where the trenches 2 are crossingly formed is started. As a result, the etching of the region where the trenches 2 are crossingly formed is started later than the region where the trenches 2 are formed in parallel to each other, and thus the trenches 2 are formed shallow (FIG. 8(c)).

The depth of the surface of the silicon carbide layer (the n+-type silicon carbide layer 6) etched during a time difference of the start of the etching of the surface of the silicon carbide layer (the n+-type silicon carbide layer 6) becomes a difference in the depth between the crossing portion of the trenches 2 and the parallel portion, which is the portion other than the crossing portion. The difference in the depth is determined according to an etching selection ratio of SiC and $SiO_2$ (an etching speed ratio: etching speed of SiC/etching speed of $SiO_2$). Because the $SiO_2$ film is used as the etching mask for the etching of SiC (the silicon carbide layer), an etching condition for the trench formation is set to a condition in which the etching selection ratio of the SiC and $SiO_2$ is at least about 2 to 5. Note that, as a condition of the dry etching itself, for example, the dry etching is carried out according to a condition conforming to the first embodiment.

In the etching conditions in this embodiment, the etching selection ratio is about 4. Therefore, the thickness of the second mask (the thin $SiO_2$ film) that covers in advance the region where the trenches 2 are crossingly formed in the region exposed from the first mask on the surface of the silicon carbide layer (the n+-type silicon carbide layer 6) is set to 100 nanometers. Therefore, before the second mask (the $SiO_2$ film) disappears and the etching of the region where the trenches 2 are crossingly formed is started, the depth of the trenches 2 in regions other than that region reaches the depth of 400 nanometers. When the trenches 2 are etched to the depth of 2 micrometers, the depth of the crossing portion of the trenches 2 is 1.6 micrometers.

Thereafter, the trench-gate type silicon carbide MOSFET according to the third embodiment can be formed in the same manner as the formation in the first embodiment and the second embodiment (FIG. 8(*d*) to FIG. 8(*f*)).

As explained above, in this embodiment, in the region where the first mask is not formed (the region exposed from the first mask) on the surface of the silicon carbide layer (the n+-type silicon carbide layer 6) in which the trenches 2 are formed, the dry etching is carried out in a state in which only the region where the trenches 2 are crossingly formed is, covered with the thin $SiO_2$ film (the second mask). Consequently, in the region where the trenches 2 are crossingly formed, timing when the etching is started is later than timing in the region where the trenches 2 are formed in parallel to each other. Therefore, the trenches 2 are formed shallower than the trenches 2 in the region where the trenches 2 are formed in parallel to each other.

In this embodiment, the crossing portion of the trenches 2 is formed shallow. Therefore, there is no problem in a filling characteristic of the gate electrode material. Gate electrode formation with satisfactory connectivity is possible. In this embodiment, as in the first embodiment and the second embodiment, in the crossing portion of the trenches 2 where electric fields concentrate most, the distance between the drain electrodes on the semiconductor device rear surface and the corresponding gate electrode 1 is larger than the distance in the other portions. Therefore, semiconductor device deterioration due to dielectric breakdown does not occur, and thus it is possible to obtain high reliability.

In this embodiment, the $SiO_2$ film (the second mask) that covers the crossing portion of the trenches 2 only has to be formed at appropriate thickness according to the etching selection ratio of SiC and $SiO_2$ in the etching conditions such that a desired difference in the depth of the trenches 2 occurs. Therefore, a degree of freedom is high in forming the structure of the trench-gate type silicon carbide MOSFET explained in the first embodiment and the second embodiment.

In this embodiment, $SiO_2$ is used as the material of the second mask that covers the region where the trenches 2 are crossingly formed in the region where the first mask is not formed on the surface of the silicon carbide layer. However, the material of the second mask does not need to be $SiO_2$ in particular. The same effect is obtained if the material of the second mask is a material that disappears during the etching of SiC such as polysilicon or silicon nitride ($Si_3N_4$). However, a material having high resistance against an etching condition of SiC is preferable because thickness necessary for the second mask becomes smaller and accuracy of trench width is not spoiled.

Similarly, in this embodiment, $SiO_2$ is used for the material of the first mask. However, the material of the first mask does not need to be $SiO_2$ in particular. The material of the first mask only has to be a material having sufficient resistance under the etching condition of SiC and capable of surely forming the trenches 2.

Fourth Embodiment

In the fourth embodiment, as explained in the first embodiment and the second embodiment, in the process for forming the trenches 2 in the silicon carbide layer, trenches 2 are formed using etching conditions under which the width of the trenches 2 affects the depth of the trenches 2 more. By using the etching conditions under which the width of the trenches 2 affects the depth of the trenches 2 more, it is possible to provide a more difference between the etching depth of the region where the trenches 2 are formed in parallel to each other and that of the region where the trenches 2 are crossingly formed. There is an effect of increasing a degree of freedom of setting of etching conditions by changing the trench width of the crossing portion of the trenches 2. In following explanation, the shape of the trenches 2 in the surface direction of the silicon carbide semiconductor substrate is focused on and explained. A basic structure of the trench-gate type silicon carbide MOSFET according to the fourth embodiment can be formed the same as the basic structure in the first embodiment or the second embodiment.

Figure 9:
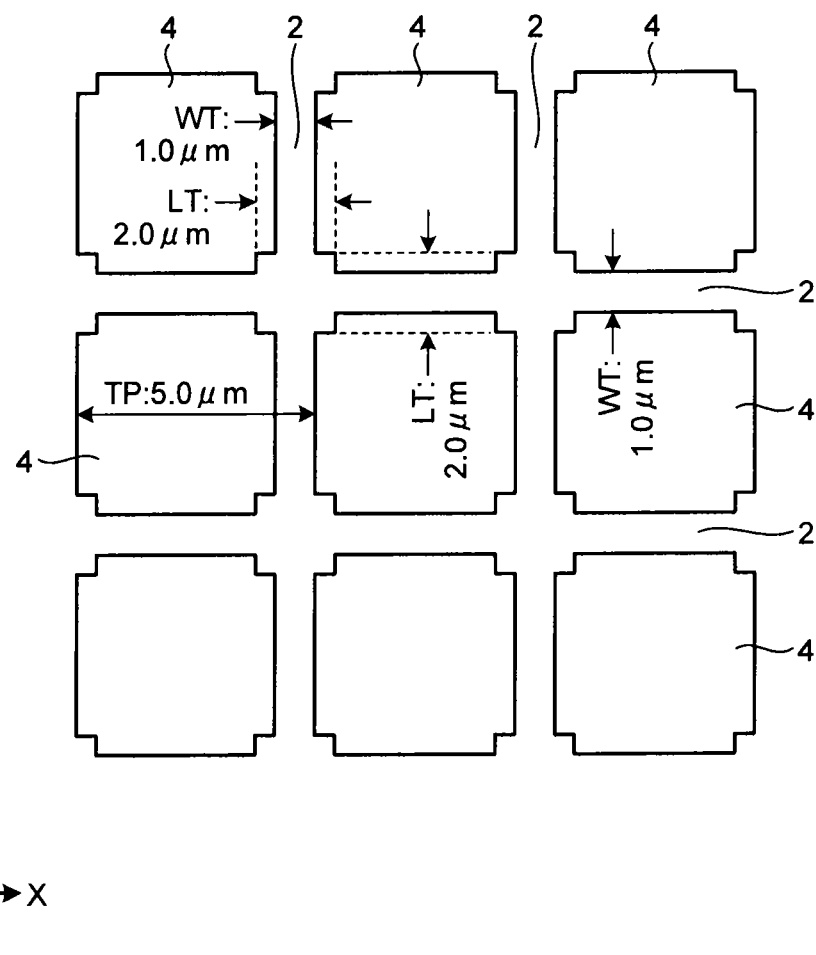
FIG. 9 is a schematic view of formation patterns of trenches according to a fourth embodiment of the present invention.

Specifically, by setting the trench width of the crossing portion of the trenches 2 wider as shown in FIG. 9, it is possible to form the trench depth of the crossing portion of the trenches 2 small. FIG. 9 is a schematic diagram of formation patterns of the trenches 2 according to the fourth embodiment. In the trenches 2 arranged in a lattice shape in the surface direction of the silicon carbide substrate of the n-type at trench width WT: 1 μm and a trench pitch TP: 5 μm of the parallel portion of the trenches 2, length LT along the extending directions of the crossing trenches 2 in a crossing portion of the trenches 2 is formed at 2 micrometers only in a range close to the crossing portion of the trenches 2. The crossing portion of the trenches 2 assumes a square shape in the surface direction of the silicon carbide substrate of the n-type.

The trench-gate type silicon carbide MOSFET according to the fourth embodiment can be formed by using the process explained in the first embodiment to the third embodiment. In this case, the shape of the first mask including openings corresponding to patterns of the trenches 2 for forming the trenches 2 only has to be formed to correspond to the formation patterns of the trenches 2 shown in FIG. 9.

In the fourth embodiment, the trenches are formed using the etching conditions same as the etching conditions in the first embodiment. As a result, from the standardized etching characteristics shown in FIG. 5, the depth of the parallel portion of the trenches 2 is 1.0 D, the depth in the crossing portion of the trenches 2 is 0.5 D, and the depth of the crossing portion of the trenches 2 can be formed in depth of 50% of the depth of the parallel portion of the trenches 2. The trench width of the crossing portion of the trenches 2 is about 2.8 micrometers, which is about 1.4 times as large as 2 micrometers. That is, by setting the length LT along the extending directions of the crossing trenches 2 in the crossing portion of the trenches 2 larger than the trench width WT of the parallel portion of the trenches 2, it is possible to further increase the trench width of the crossing portion of the trenches 2. It is possible to form the trench depth of the crossing portion of the trenches 2 small.

The dimension of the length LT along the extending directions of the crossing trenches 2 in the crossing portion of the trenches 2 is preferably kept up to the length equivalent to a range obtained by adding a dimension of 20% of a repetition pitch (the trench pitch TP) of the trenches 2 to the width of the portion where the trenches 2 are formed in parallel to each other (the trench width WT of the parallel portion of the trenches 2) in both the directions in which the trenches 2 cross, that is, two extending directions of the crossing trenches 2 (an X direction and a Y direction in FIG. 9). This is because of necessity of securing contact regions formed in the n+-type silicon carbide layer 6 and the p+-type silicon carbide layers 7.

Note that the matters explained in the embodiments can be used in combination with one another.

REFERENCE SIGNS LIST

1 Gate electrodes
2 Trenches
3 Electric contact regions
4 n-type epitaxial silicon carbide layer
5 p-type silicon carbide layer
6 n+-type silicon carbide layer
7 p+-type silicon carbide layers
8 Gate insulating film
9 Insulating film
10 Source electrode
LT Length along extending directions of crossing trenches in a crossing portion of the trenches
TP Trench pitch
WT Trench width of a parallel portion of the trenches

The invention claimed is:

1. A silicon carbide semiconductor device comprising:
trenches formed in a lattice shape on a surface of a silicon carbide substrate on which a semiconductor layer is formed;
an insulating film formed inside of the trenches; and
gate electrodes formed inside of the trenches via the insulating film, wherein
the gate electrodes formed inside of the trenches are connected in a lattice form within the trenches,
in the silicon carbide substrate, a plurality of electric contact regions, which are formed in a distributed manner in a region different from the region in which the gate electrodes are formed, are provided for inputting signals to the gate electrodes,
a depth of the trenches in a portion where the trenches are crossingly formed is smaller than a depth of the trenches in a portion where the trenches are formed in parallel to each other,
bottoms of the trenches in the portion where the trenches are formed in parallel to each other are continuously connected to adjacent bottoms of trenches by inclined faces in the portion where the trenches are crossingly formed.

2. The silicon carbide semiconductor device according to claim 1, wherein the depth of the portion where the trenches are crossingly formed is in a range between 40% or larger and 80% or smaller of the depth of the portion where the trenches are formed in parallel to each other.

3. The silicon carbide semiconductor device according to claim 1, wherein an aspect ratio, which is a value obtained by dividing the depth of the trenches in the portion where the trenches are crossingly formed by a width of the trenches in the portion where the trenches are crossingly formed, is in a range between 0.1 or larger and 1 or smaller.

4. The silicon carbide semiconductor device according to claim 1, wherein a width of the trenches in the portion where the trenches are crossingly formed is larger than a width of the trenches in the portion where the trenches are formed in parallel to each other.

5. The silicon carbide semiconductor device according to claim 4, wherein, in all extending directions of the crossing trenches, the width of the trenches in the portion where the trenches are crossingly formed is equal to or smaller than a value obtained by adding 20% of a repetition pitch of the trenches to the width of the trenches in the portion where the trenches are formed in parallel to each other.

6. The silicon carbide semiconductor device according to claim 1, wherein
the silicon carbide substrate has a structure in which a p-type semiconductor layer is formed on an n-type semiconductor layer, and
the bottom surface of the trenches in the portion where the trenches are crossingly formed is the p-type semiconductor layer.

* * * * *